United States Patent

Kamimura et al.

[11] 4,045,669
[45] Aug. 30, 1977

[54] ELECTRON MICROSCOPE

[75] Inventors: Shoji Kamimura, Katsuta; Yasushi Saito, Mito, both of Japan

[73] Assignee: Hitachi, Ltd., Tokyo, Japan

[21] Appl. No.: 712,664

[22] Filed: Aug. 9, 1976

[30] Foreign Application Priority Data

Aug. 13, 1975  Japan .................................. 50-97566

[51] Int. Cl.² ............................................. H01J 37/26
[52] U.S. Cl. ..................................... 250/311; 250/397
[58] Field of Search ............... 250/306, 307, 309, 310, 250/311, 396, 397, 398, 399

[56] References Cited

U.S. PATENT DOCUMENTS 3,504,176  3/1970  Thon ................................... 250/311
3,558,885  1/1971  Flemming ........................... 250/311
3,937,959  2/1976  Namae ................................ 250/311

Primary Examiner—Craig E. Church
Attorney, Agent, or Firm—Beall & Jeffery

[57] ABSTRACT

A condenses lens system condenses an elctron beam onto a specimen. The electron beam thus transmitted through the specimen is magnified by a magnifying lens system. The magnified electron beam is projected onto a fluorescent screen, and the image of the specimen is visually observed. The quantity of electrons per unit area in the magnified electron beam is detected by an electron beam detector. In response to the detected signal, the condenser lens system is controlled so as to make constant the quantity of electrons per unit area in the magnified electron beam.

12 Claims, 4 Drawing Figures

ELECTRON MICROSCOPE

BACKGROUND OF THE INVENTION

1. Field of the Invention

This invention relates to an electron microscope, and more particularly to an electron microscope in which the brightness of a specimen image is automatically adjusted.

2. Description of the Prior Art

In an electron microscope, the magnification of a specimen image need generally be varied over a wide range. In general, the electron microscope is equipped with the so-called multistage magnifying lens system which comprises three to five magnifying lenses including an objective lens. The magnification can be varied by varying the excitation currents of the magnifying lenses. It is undesirable, however, to vary the excitation currents of the respective magnifying lenses while neglecting an aberration which is caused by changing widely the excitation current of each magnifying lens. For this reason, the excitation currents of the respective magnifying lenses are so pre-determined that the aberration of the magnifying lens system may be minimized at the respective magnifications within the magnification range as actually used, with the result that the highest performance may be attained the whole electron microscope. To manually vary the excitation currents in accordance with the respective magnifications is extremely troublesome, and increases occasions on which erroneous exciting currents are set. Usually, the magnification need not necessarily be varied continuously over the wide range. From these viewpoints, the following measure is taken in the electron microscope. The magnification is varied stepwise by manipulating a magnification setting manipulator (which is generally a knob). The exciting currents of the respective magnifying lenses are set stepwise automatically in interlocking relationship with the magnification setting manipulator to values at which the aberration of the magnifying lens system is minimized at each magnification to be set.

The brightness of a specimen image is inversely proportional to the square of the magnification of the specimen image. Therefore, the specimen image is too bright or too dark in dependence on the magnification of the specimen image.

In general, the brightness of the specimen image is manually adjusted each time the magnification is changed. Such method, however, is troublesome in manipulation and increases occasions of erroneous manipulation. In order to solve the problems, the adjustment of the brightness of the specimen image may be interlocked with the setting of the magnification. In this case, however, there is the problem that a fluctuation in the brightness of the specimen image as attributed to factors other than the magnification, e.g., a fluctuation in an electron beam and light having leaked from the exterior of the electron microscope to the interior thereof, cannot be compensated for.

If, as described above, the brightness must be switched stepwise in interlocking relationship with switching of the magnification stepwise, then the number of wirings in an electric circuit therefor becomes large and the degradation of reliability is inevitable. This problem is more conspicuous as the number of magnifications to be set is larger.

SUMMARY OF THE INVENTION

It is therefore an object of this invention to provide an electron microscope in which the brightness of a specimen image is automatically adjusted.

Another object of this invention is to provide an electron microscope which can compensate for a fluctuation in the brightness of a specimen image as attributed to any factor other than the magnification.

Still another object of this invention is to provide an electron microscope whose reliability is high.

In accordance with this invention, an electron beam emitted from an electron beam radiating source is condensed onto a specimen by a condenser lens system, the electron beam thus transmitted through the specimen is magnified by a magnifying lens system, and the magnified electron beam is converted into a visual specimen image. The magnified electron beam is detected by an electron beam detector, and is converted into an electric signal. On the basis of the electric signal, the condenser lens system is controlled so that the quantity of electrons per unit area of the magnified electron beam may become substantially constant.

Other objects and features than those mentioned above will become apparent from the following detailed description made with reference to the drawings.

DESCRIPTION OF THE PREFERRED EMBODIMENTS

Figure 1:
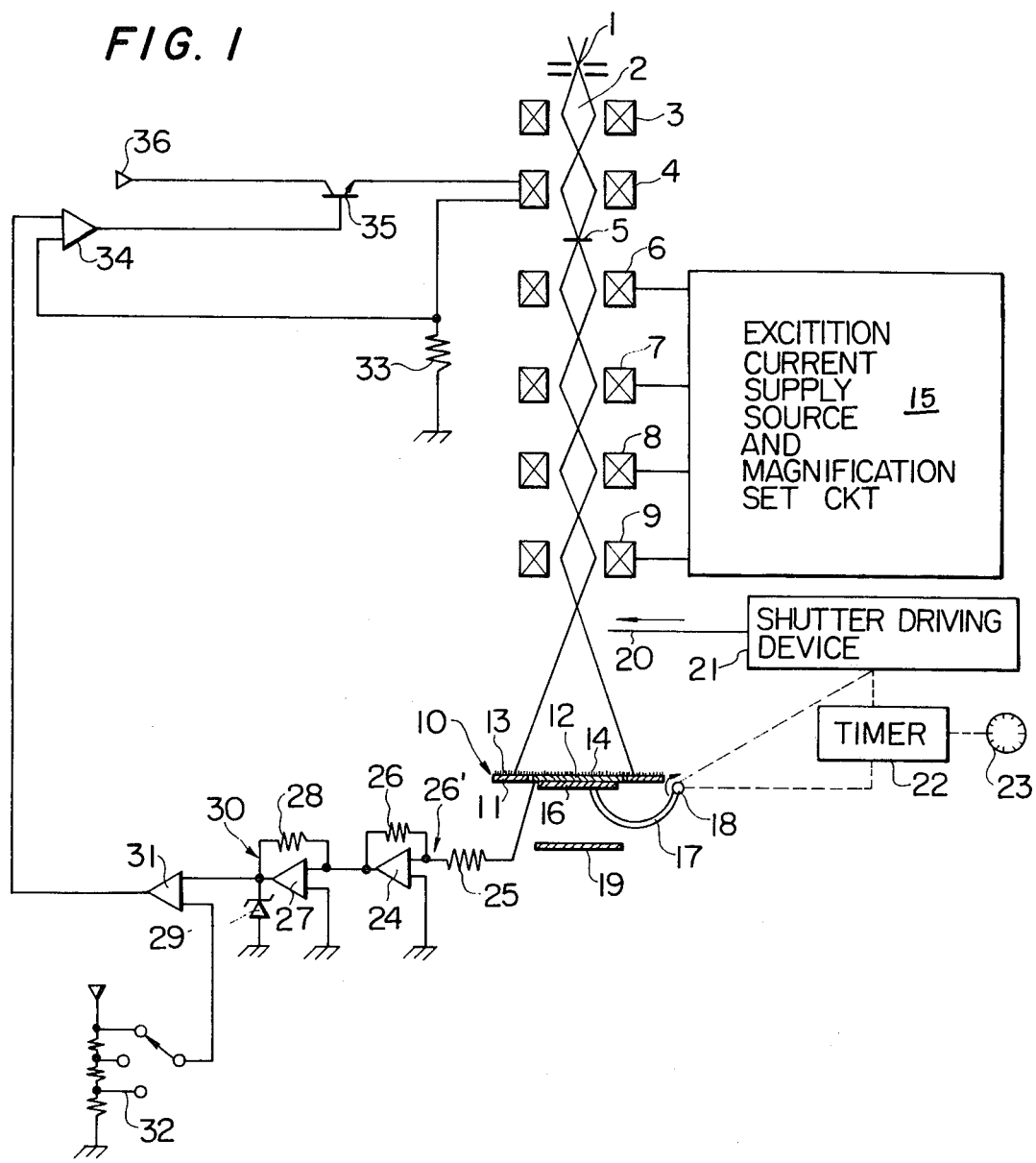
FIG. 1 is a schematic constructional diagram of an electron microscope showing an embodiment of this invention.

Referring to FIG. 1, an electron beam 2 emitted from an electron gun 1 being an electron beam radiating source is condensed onto a specimen 5 by a condenser lens system which comprises first and second condenser lenses 3 and 4. The condenser lens system may well comprise a single condenser lens. The electron beam 2 transmitted through the specimen 5 is magnified and projected onto an image observation unit 10 by a magnifying lens system which comprises an objective lens 6, an intermediate lens 7, a first projective lens 8 and a second projective lens 9.

The image observation unit 10 includes a stationary plate 11, a movable plate 12 which is arranged in a central opening of the stationary plate, and fluorescent screens 13 and 14 which are respectively formed on the substrates 11 and 12. Accordingly, the magnified electron beam 2 projected on the image observation unit 10 is converted into a visual specimen image by the fluorescent screens 13 and 14, so that an observer can observe the specimen image. The magnification of the specimen image can be varied by an excitation current supply source and magnification setting circuit 15. That is, the magnification can be varied by varying excitation currents which are fed from the excitation current supply source and magnification setting circuit 15 to the respective magnifying lenses.

The stationary plate 11 and the movable plate 12 of the image observation unit 10 are made of an electrically conductive material such as aluminum. The movable plate 12 is fixed on an electric insulation plate 16, which in turn is fixed to a manipulating shaft 18 by an arm 17. Accordingly, when the manipulating shaft 18 is turned to open the movable plate 12, the magnified electron beam 2 is projected onto a film or dry plate 19 through the central opening of the fixed plate 11. Thus, the specimen image is photographed.

A shutter 20 is switched by a driving device 21 between a release position which is illustrated and an interception position at which the magnified electron beam is intercepted. The driving device 21 interlocks with the manipulating shaft 18 so that when the movable plate 12 is opened, the shutter 19 may be released. When the manipulating shaft 18 is manipulated to open the movable plate 12 and accordingly the shutter 20, a timer 22 is started. The timer 22 bestows a signal on the driving device 21 after a period of time which is set with an exposure time setting unit 23 beforehand. Thus, the shutter 20 is closed when the signal is received by the driving device 21. In this manner, by opening the movable plate 12, the shutter 20 is released in interlocking therewith and also the timer 22 is started, the film or dry plate 19 is exposed to the magnified electron beam 2 during the period of time which is previously set by the exposure time setting unit 23, and thereafter the shutter 20 is automatically closed to complete the photographing.

When the magnified electron beam 2 is projected onto the fluorescent screen 14, the fluorescent screen is electrified, and charges migrate to the movable plate 12. Here, insofar as the specimen image is observed on the image observation unit 10 at optional magnifications within a magnification range actually used, the movable plate 12 shall have such a size that its entire area is infallibly irradiated by the magnified electron beam 2, and the movable plate 12 shall be so arranged as not to come into electrical contact with the stationary plate 11. With such measure, the movable plate 12 can be utilized as an electrode for detecting a current signal which is proportional to the quantity of electrons per unit area of the magnified electron beam 2 projected on the image observation unit 10. The current signal thus detected is converted into a voltage by a current-voltage transducer 26' which comprises an amplifier 24, an input resistance 25 and a feedback resistance 26. The voltage is given to one input of a differential amplifier 31 via a voltage limiter circuit 30 which comprises an amplifier 27, a feedback resistance 28 and a zener diode 29. The other input of the differential amplifier 31 receives a reference voltage from a brightness setting circuit 32. The brightness setting circuit 32 can produce the reference voltage in several values. Such reference voltages represent the brightnesses of the specimen image to be set, respectively. The differential amplifier 31 compares the voltages applied to the two inputs thereof. Where the difference between the voltages applied to the two inputs is zero, the differential amplifier 31 generates a voltage of a certaiin fixed level. It provides a voltage which varies depending upon the difference between the voltages applied to the two inputs thereof. The output voltage of the differential amplifier 31 is applied to one input of another differential amplifier 34. The excitation current of the second condenser lens 4 being the final-stage condenser lens is detected in the form of a voltage by a detecting resistance 33. The detected voltage is applied to the other input of the differential amplifier 34. The differential amplifier 34 compares the voltages applied to the two inputs thereof. It generates a voltage which has a certain fixed level when the difference between the voltages applied to the two inputs is zero and which varies depending upon the difference between the two applied voltages. The output voltage of the differential amplifier 34 is given to the base of a control transistor 35. In dependence on the output voltage of the differential amplifier 34, the control transistor 35 controls the excitation current which flows from an excitation current supply source terminal 36 through the control transistor 35 to the second condenser lens 4.

Accordingly, if the specimen image becomes darker than the brightness set by the brightness setting circuit 32, a voltage which corresponds to the difference between the actual brightness and the set brightness is obtained at the output of the differential amplifier 31. The output voltage is compared in the differential amplifier 34 with the voltage detected by the detecting resistance 33, and the resultant difference voltage is provided at the output of the differential amplifier 34. On the basis of the output voltage of the differential amplifier 34, the control transistor 35 increases the excitation current from the excitation current supply source 36 to the second condenser lens 4. Thus, the specimen image is automatically maintained at the brightness set by the brightness setting circuit 32. Where the specimen image is brighter than the brightness set by the brightness setting circuit 32, conversely the excitation current to the second converging lens 4 is automatically reduced by the control transistor 35. Of course, where the brightness of the specimen image is equal to the brightness set by the brightness setting circuit 32, the difference of the voltages applied to the two inputs of each of the differential amplifiers 31 and 34 becomes zero, and hence, the excitation current of the second converging lens 4 is maintained as it is. In this manner, a fluctuation in the brightness of the specimen image as attributed to the change-over of the magnification or any other factor is automatically compensated for.

Figure 2:
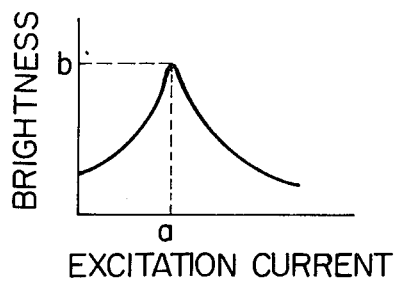
FIG. 2 is a graph showing the relationship of the brightness of a specimen versus the excitation current of a second condenser lens.

FIG. 2 illustrates the relationship between the excitation current of the second condenser lens 4 and the brightness of the specimen image. As apparent from the graph, the brightness of the specimen image rises up to the point $b$ with the increase of the excitation current of the second condenser lens 4 up to point $a$; whereas the brightness of the specimen image decreases beyond the point $b$ with a corresponding increase of the excitation current of the second condenser lense 4 beyond the point $a$.

The automatic brightness control system in FIG. 1 can be used in order to automatically control the brightness of the specimen image by varying the excitation current of the second condenser lens 4 within a range below the point $a$ in FIG. 2. In this case, the brightness setting circuit 32 ought to be designed so that the brightness to be set may not become higher than a brightness $b$ corresponding to the excitation current $a$. The voltage limiter circuit 30 need be made so that its output voltage may not become higher than a voltage corresponding to the brightness $b$. For the latter purpose, the zener diode 29 is employed in the voltage limiter circuit 30. More specifically, when the input voltage of the voltage limiter circuit 30 becomes excessively great, a current comes to flow through the zener diode 29, and hence, the output voltage of the voltage limiter circuit 30 does not rise above the zener voltage.

Figure 3:
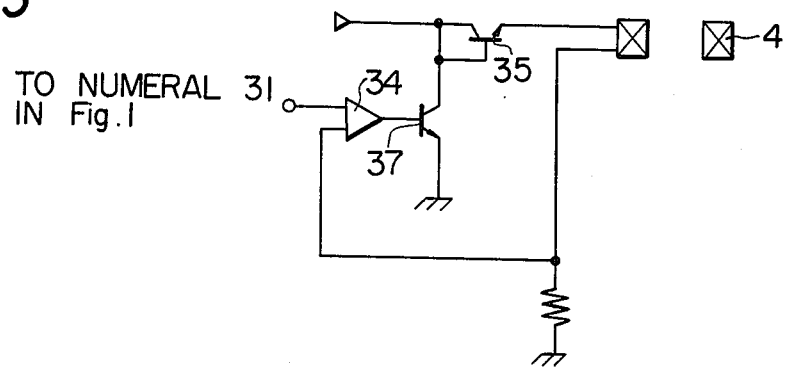
FIG. 3 is a connection diagram showing a modification of a part of an electric circuit in the electron microscope of FIG. 1.

The brightness of the specimen image can also be automatically controlled by varying the excitation current of the second condenser lens 4 within a range above the point $a$ in FIG. 2. In this case, when the specimen image is darker than the brightness set by the brightness setting unit 32, it suffices to reduce the excitation current to the second condenser lens 4 contrariwise to the case of FIG. 1. In the circuit arrangement, therefore, another transistor 37 may be connected between the output of the differential amplifier 34 and the base of the control transistor 35 in FIG. 1 as is illustrated in FIG. 3. In FIG. 3, the same symbols as in FIG. 1 designate the same parts.

In the explanation thus far made, in order to automatically control the brightness, the excitation current of the second condenser lens is varied. In lieu of this measure, the excitation current of the first condenser lens 3 may be varied. The first condenser lens 3 has the characteristic that the specimen image becomes brighter with the increase of the excitation current thereof. In this case, accordingly, the automatic brightness control system as shown in FIG. 1 can be employed.

From the above description of the embodiments, it is appreciated that the fluctuation in the brightness of the specimen image is automatically compensated for, and that since the automatic brightness control system is made independent of the magnification switching system in the circuit arrangement, the problems of the increase of the number of wirings and the attendant degradation of the reliability as previously stated are not offered.

Figure 4:
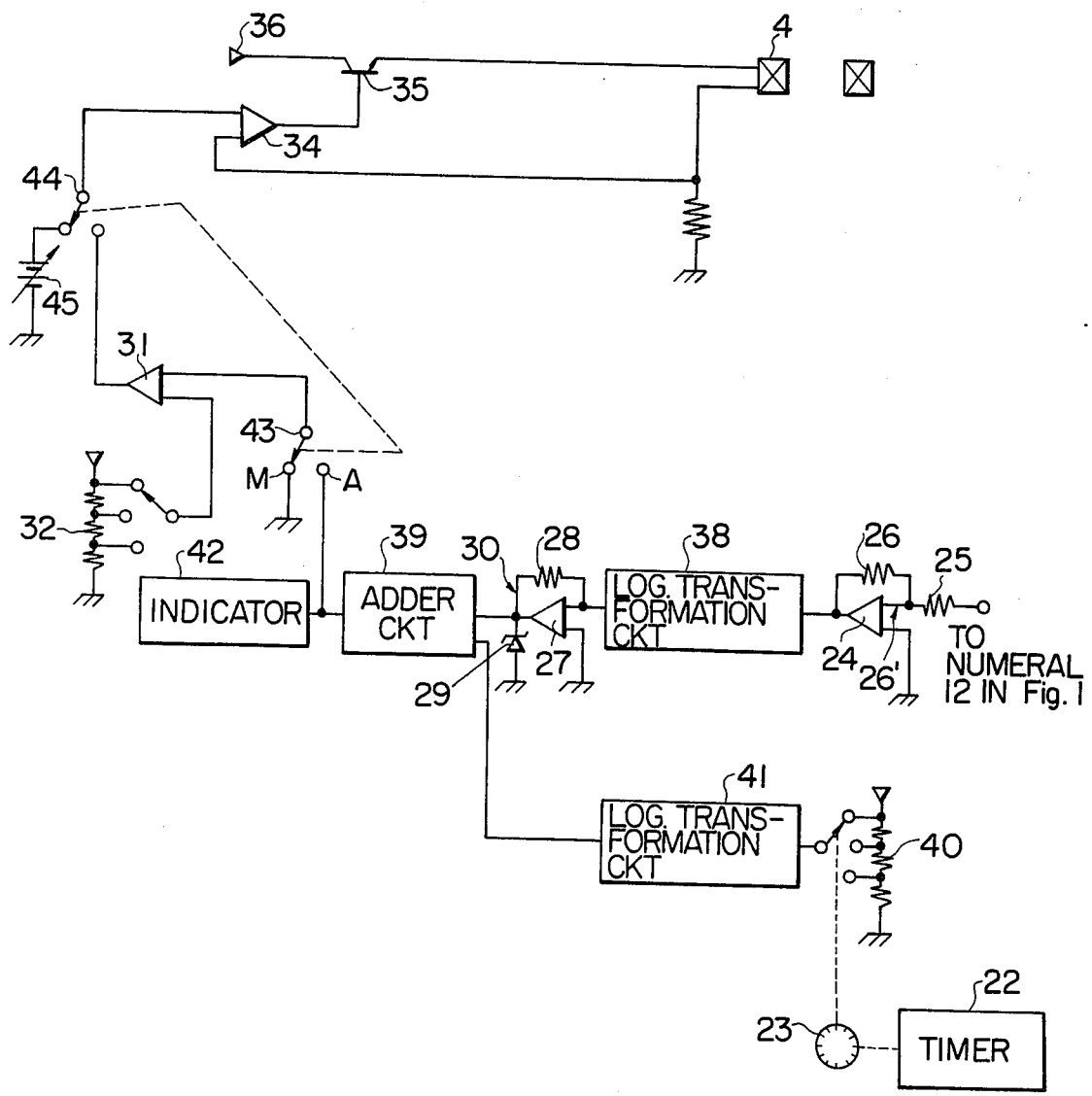
FIG. 4 is a diagram showing another embodiment of the electric circuit in the electron microscope of FIG. 1.

FIG. 4 is an electric circuit diagram of the electron microscope illustrating another embodiment of this invention. The elements shown by numerals 1 – 23 in FIG. 1 are utilized as they are in the electric circuit of FIG. 4. In FIGS. 1 and 4, the same symbols indicate the same elements.

Referring to FIG. 4, the current-voltage transducer 26' converts into a voltage a current which is proportional to the quantity of electrons per unit area in the magnified electron beam 2 projected on the image observation unit 10. After the voltage is subjected to the logarithmic transformation by a logarithmic transformation circuit 38, it is applied via the voltage limiter circuit 30 to one input of an adder circuit 39. On the other hand, a variable d.c. voltage circuit 40 interlocks with the exposure time setting unit 23 and generates a d.c. voltage proportional to an exposure time determined thereby. After the voltage is subjected to the logarithmic transformation by another logarithmic transformation unit 41, it is applied to the other input of the adder circuit 39. The output value of the adder circuit 39 accordingly represents a value proportional to the product between the electronic current and the exposure time, that is, a coulomb quantity. The coulomb quantity is indicated on an indicator 42. Accordingly, when switches 43 and 44 are changed-over to positions M ("MANUAL"), a change in the brightness of the specimen image as attendant upon the change-over of the magnification can be compensated for in such a way that the excitation current of the second condenser lens 4 is changed by changing the voltage of a variable reference voltage source 45 while reading the indication value of the indicator 42. Alternatively, the compensation can be made in such a way that the exposure time, accordingly the voltage of the variable d.c. voltage circuit 40, is changed by means of the exposure time setting unit 23. Thus, even when the magnification is changed-over, the photographing of the specimen image can be carried out under the optimum exposure condition.

In the electron microscope, an electron optical axis adjusting manipulation need be executed previously to the observation or photographing of the specimen image. In this case, the switches 43 and 44 are changed-over to the position M ("MANUAL").

On the other hand, when the switches 43 and 44 are changed-over to positions A ("AUTO"), the output voltage of the adder 39 is applied to one input of the differential amplifier 31, and hence, the same automatic brightness control system as in FIG. 1 is constructed. Accordingly, the change in the brightness of the specimen image as attributed to the change-over of the magnification or any other factor is automatically compensated for. It is therefore understood that the electric circuit in FIG. 4 achieves quite the same functional effects as in FIG. 1. Of course, also in the circuit of FIG. 4, another transistor 37 may be connected between the differential amplifier 34 and the base of the control transistor 35 as illustrated in FIG. 3.

While the preferred embodiments of this invention have been described with reference to the drawings, several modifications or alterations can be made without departing from the essence of this invention, and it is therefore to be understood that the scope of this invention ought to be determined by the following claims only.

We claim:

1. An electron microscope comprising means to radiate an electron beam, means to condense said electron beam from the radiation means onto a specimen, means to magnify the electron beam having been transmitted through said specimen by condensing said electron beam onto said specimen, means to convert the magnified electron beam into a visual specimen image, means to detect said magnified electron beam and to convert it into an electric signal, and means to control the condensing means in response to said electric signal so that a quantity of electrons per unit area in said magnified electron beam is held substantially constant.

2. An electron microscope comprising means to radiate an electron beam, means to condense said electron beam from the radiation means onto a specimen, means to magnify the electron beam having been transmitted through said specimen by condensing said electron beam onto said specimen, means for observing the magnified electron beam as a visual specimen image, the observation means being arranged at a position on which said magnified electron beam is projected, means to detect said magnified electron beam as an electric signal which is proportional to a quantity of electrons per unit area in said electron beam, and means to controlthe condensing means in response to said electric signal so that said quantity of electrons per unit area in said magnified electron beam is held substantially constant.

3. The electron microscope according to claim 2, wherein the control means comprises means to convert said electric signal into a voltage, means to generate a reference voltage, first comparison means to compare the converted voltage with said reference voltage of the reference voltage generating means and produce a correlated output voltage, second means to detect as a voltage a current flowing through said condensing means, second comparison means to compare the output voltage of the second means to detect with the output voltage of said first comparison means and produce a correlated output voltage, and said means to control controlling the current flowing through said condensing means in response to the output voltage of said second comparison means.

4. The electron microscope according to claim 3, wherein said reference voltage generating means is adjustable to produce a selectively variable reference voltage.

5. The electron microscope according to claim 3, wherein said means to control said condensing means includes means to suppress said voltage from the means to convert to said first comparison means to below a fixed value.

6. The electron microscope according to claim 2, wherein said condensing means comprises two condenser lenses and wherein the control means comprises means to convert said electric signal into a voltage, means to generate a variable reference voltage, first comparison means to compare the converted voltage with said variable reference voltage and produce a correlated output voltage, second means to detect as a voltage a current which flows through one of said two condenser lenses, second comparison means to compare the output voltage of the second means to detect with the output voltage of said first comparison means and produce a correlated output voltage, and means to control said current flowing through said one condenser lens in response to the output voltage of said second comparison means.

7. The electron microscope according to claim 6, wherein said means to control said condensing means includes means to suppress said voltage from the means to convert to said first comparison means to below a fixed value.

8. The electron microscope according to claim 6, wherein the means for observing includes a first fluorescent screen having a central opening and a fluorescent screen serving to convert said magnified electron beam into said visual specimen image, wherein the means to detect includes an electrical conductor for supporting the second fluorescent screen, and means to move said electrical conductor along with said second fluorescent screen between a position in said central opening and a position removed from said central opening at which part of said magnified electron beam can permeate through said central opening without striking said second screen.

9. The electron microscope according to claim 2, wherein the means for observing includes a first fluorescent screen having a central opening and a second fluorescent screen arranged at said central opening, said fluorescent screens serving to convert said magnified electron beam into said visual specimen image, wherein the means to detect includes an electrical conductor for supporting the second fluorescent screen, and means to move said electrical conductor along with said second fluorescent screen between a position in said central opening and a position removed from said central opening at which part of said magnified electron beam can permeate through said central opening without striking said second screen.

10. An electron microscope comprising means to radiate an electron beam, condensing means to condense said electron beam from the radiation means onto a specimen, means to magnify the electron beam having been transmitted through said specimen by condensing said electron beam onto said specimen, means for observing the magnified electron beam as a visual specimen image, the observation means being arranged at a position on which said magnified electron beam is projected, means to detect said magnified electron beam as an electric signal which is proportional to a quantity of electrons per unit area in said electron beam, means to subject said electric signal to a logarithmic transformation and produce a corresponding output signal, means to generate a variable d.c. signal, means to subject said variable d.c. signal to a logarithmic transformation and produce a corresponding output signal, means to add output signals of both the logarithmic transformation means and produce a corresponding output signal, and means to control said condensing means in response to an output signal of the adding means so that said quantity of electrons per unit area in said magnified electron beam is held substantially constant.

11. The electron microscope according to claim 10, further comprising means to selectively connect and disconnect the control means to said adding means.

12. The electron microscope according to claim 10, further comprising means to receive the output of said adding means and produce a visual indication of the total quantity of electrons received by said means to detect over a fixed period of time, manual means for controlling said condensing means to supply a manually variable control voltage to said control means to change the quantity of electrons per unit area in said magnified electron beam, and means to selectively connect the control means to said adding means in one mode of operation and in another mode of operation to disconnect the control means from said adding means and connect said control means to said manual means.

* * * * *